US011996840B1

(12) United States Patent
Koehler et al.

(10) Patent No.: US 11,996,840 B1
(45) Date of Patent: May 28, 2024

(54) LIGHT CONTROLLED SWITCH MODULE

(71) Applicant: The Government of the United States of America, as represented by the Secretary of the Navy, Arlington, VA (US)

(72) Inventors: Andrew D Koehler, Alexandria, VA (US); Travis J. Anderson, Alexandria, VA (US); Geoffrey M. Foster, Woodbridge, VA (US); Karl D. Hobart, Alexandria, VA (US); Francis J. Kub, Arnold, MD (US); Michael A. Mastro, Fairfax, VA (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 0 days.

(21) Appl. No.: 18/463,462

(22) Filed: Sep. 8, 2023

Related U.S. Application Data

(60) Provisional application No. 63/405,061, filed on Sep. 9, 2022.

(51) Int. Cl.
*H03K 17/785* (2006.01)

(52) U.S. Cl.
CPC . *H03K 17/785* (2013.01); *H03K 2217/94108* (2013.01)

(58) Field of Classification Search
CPC ............ H03K 17/785; H03K 2217/94108
See application file for complete search history.

(56) References Cited

U.S. PATENT DOCUMENTS 4,119,845 A * 10/1978 Jaskolski ........... H03K 17/0824
349/199
5,804,815 A  9/1998 Loubriel et al.
(Continued)

FOREIGN PATENT DOCUMENTS

| JP | 2007337579 A | 8/2008 |
|---|---|---|
| KR | 20160086894 A | 1/2017 |
| WO | 2019059932 A1 | 3/2019 |

OTHER PUBLICATIONS

Korean Intellectual Property Office, International Search Report and Written Opinion of the International Search Authority, Dec. 29, 2023, International Application No. PCT/US2023/073716.

(Continued)

*Primary Examiner* — Seung C Sohn
(74) *Attorney, Agent, or Firm* — US Naval Research Laboratory; Jorie L. Stroup

(57) ABSTRACT

Light controlled switching modules are provide. In embodiments, a light controlled switching module includes: a housing; a light controlled semiconductor switch mounted to the housing, the light controlled semiconductor switch including a semiconductor body; at least one light source mounted to the housing in a spaced relationship from the light controlled semiconductor switch and positioned to direct light emitted from the at least one light source toward the semiconductor body; and first and second electrodes mounted to the housing and connected to the light controlled semiconductor switch, wherein the first and second electrodes are configured to have variable resistance between the first and the second electrode.

20 Claims, 6 Drawing Sheets

(56) References Cited

U.S. PATENT DOCUMENTS

| | | | |
|---|---|---|---|
| 6,248,992 B1* | 6/2001 | Baca | H01L 31/09 |
| | | | 257/E31.093 |
| 8,125,089 B2 | 2/2012 | Caporaso | |
| 8,563,957 B2 | 10/2013 | Caporaso | |
| 9,142,339 B2 | 9/2015 | Sampayan | |
| 9,595,623 B1 | 3/2017 | Xie | |
| 10,403,780 B2 | 9/2019 | Jang | |
| 11,366,401 B2 | 6/2022 | Sampayan | |
| 2002/0176649 A1 | 11/2002 | Bao et al. | |
| 2009/0121265 A1 | 5/2009 | Abele | |
| 2013/0056842 A1 | 3/2013 | Sullivan et al. | |
| 2018/0053872 A1 | 2/2018 | Jang | |
| 2020/0075529 A1 | 3/2020 | Otsuka et al. | |
| 2022/0320360 A1 | 10/2022 | DeJarld et al. | |

OTHER PUBLICATIONS

Chao Liu, "Metal-interconnection-free integration of InGaN/GaN light emitting diodes with AlGaN/GaN high electron mobility transistors", Applied Physics Letters, May 8, 2015, pp. 18110-0 through 188110-4, vol. 106, AIP Publishing, Melville, NY, USA.

Guillermo M. Loubriel, "Photoconductive Semiconductor Switches", IEE Transactions on Plasma Science, Apr. 2, 1997, pp. 123-130, vol. 25, No. 2, IEEE Xplore, https://ieeexplore.ieee.org/Xplore/home.jsp.

Travis J. Anderson, "Process Development for GaN-Based Photoconductive Semiconductor Switches (PCSS)," The Electrochemical Society (ECS) Meeting Abstracts, 2018, vol. MA2018-02.

Andrew D. Koeler, "High Voltage GaN Lateral Photoconductive Semiconductor Switches," ECS Journal of Solid State Science and Technology, Oct. 4, 2017, vol. 6(11), pp. S3099-S3102.

William C. Nunnally, "High-Power Microwave Generation Using Optically Activated Semiconductor Switches," IEE Transactions on Electron Devices, Dec. 1990, vol. 37, No. 12, pp. 2439-2448.

Friederike Zimmermann, "Current Status of Carbon-Related Defect Luminescence in GaN," Physics Status Solidi A, Aug. 24, 2021, vol. 218, 211235 (pp. 1-11), published by Wiley-VCH GmbH.

* cited by examiner

LIGHT CONTROLLED SWITCH MODULE

CROSS-REFERENCE TO RELATED APPLICATIONS

This Application is a Nonprovisional of and claims the benefit of priority under 35 U.S.C. § 119 based on U.S. Provisional Patent Application No. 63/405,061 filed Sep. 9, 2022. The Provisional Application and all references cited herein are hereby incorporated by reference into the present disclosure in their entirety.

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, D.C. 20375, USA; +1.202.767.7230; techtran@nrl.navy.mil, referencing Navy Case No. 211220-US1.

BACKGROUND

Aspects of the present invention relate generally to semiconductor switches and, more particularly, to semiconductor switch modules.

Power semiconductor device switches are used as switches in power electronics. One example of a power semiconductor device switch is an electrically gated Metal Oxide Semiconductor Field Effect Transistor (MOSFET). In general, by varying the voltage on a gate terminal of a MOSFET, a resistance between a source terminal and a drain terminal is changed. A gate driver of the MOSFET accepts a low-power input from a controller and produces a high-current drive input for the gate terminal.

Photoconductive semiconductor switches (PCSS) are opto-electrical devices made of semi-insulating semiconductor material that conduct electricity when they are turned on with light through optical excitation. In general, when photon energy is sufficient to raise electrons above a bandgap energy of a PCSS semiconductor material, free electrons are generated and electrical current flows through the PCSS.

SUMMARY

In a first aspect of the invention, there is a light controlled switch module (LCSM) including: a housing; a light controlled semiconductor switch mounted to the housing, the light controlled semiconductor switch including a semiconductor body; at least one light source mounted to the housing in a spaced relationship from the light controlled semiconductor switch and positioned to direct light emitted from the at least one light source toward the semiconductor body; and first and second electrodes mounted to the housing and connected to the light controlled semiconductor switch, wherein the first and second electrodes are configured to have variable resistance between the first and the second electrode.

In implementations of the invention, the at least one light source is electrically isolated from the light controlled semiconductor switch (e.g., with an isolation voltage of more than 100 volts (V)). In embodiments, the at least one light source is thermally isolated from the light controlled semiconductor switch (e.g., with a thermal conductivity of less than or equal to 1 Watts per meter-Kelvin (W/mk)). In aspects of the invention, a heat dissipater mounted to the housing and configured to draw heat away from the at least one light source. In implementations, a heat dissipater mounted to the housing and configured to draw heat away from the light controlled semiconductor switch. In embodiments, the LCSM further includes third and fourth electrodes mounted to the housing and configured to supply electrical current to the at least one light source, wherein the housing electrically isolates the third and fourth electrodes from the first and second electrodes.

In some embodiments, a reflector is mounted to the housing and is configured to redirect light emitted by the at least one light source such that the light emitted by the at least one light source is directed to a surface of the semiconductor body. In implementations, the semiconductor body includes a photoactive layer on a substrate, and the light emitted from the at least one light source is directed toward one or more surfaces of the photoactive layer. In aspects of the invention, the photoactive layer is selected from the group consisting of: carbon doped gallium nitride (GaN:C); iron doped gallium nitride (GaN:Fe); gallium oxide ($Ga_2O_3$); aluminum nitride (AlN); cubic boron nitride (c-BN); and diamond. In some embodiments, a thermal barrier is positioned between the at least one light source and the light controlled semiconductor switch.

In another aspect of the invention, there is a method of making a light controlled switch module (LCSM) including: mounting a light controlled semiconductor switch to a housing, the light controlled semiconductor switch including a semiconductor body; mounting at least one light source to the housing in a spaced relationship from the light controlled semiconductor switch and positioned to direct light emitted from the at least one light source toward a surface of the semiconductor body; and mounting first and second electrodes to the housing, wherein the first and second electrodes are configured to supply electrical current to the light controlled semiconductor switch. In implementations, the method further includes dissipating heat from at least one of the at least one light source and the light controlled semiconductor switch via at least one heat dissipater mounted to the housing. In embodiments, the method includes redirecting, by a reflector mounted to the housing, at least a portion of the light emitted by the at least one light source such that the light emitted by the at least one light source is directed to another surface of the semiconductor body.

In another aspect of the invention, there is a method of using a light controlled switch module (LCSM) including: initiating the application of an electric current to first and second electrodes mounted to a housing of the LCSM, wherein the first and second electrodes are configured to supply electric voltage to a light controlled semiconductor switch mounted to the housing, thereby establishing an electric field through a semiconductor body of the light controlled semiconductor switch; initiating the application of an electric current to third and fourth electrodes mounted to the housing, wherein the third and fourth electrodes are configured to supply electric current to at least one light source mounted to the housing in a spaced relationship to the light controlled semiconductor switch; and emitting, by the at least one light source in response to initiating the application of the electric current to the third and fourth electrodes, light toward a surface of the semiconductor body, thereby causing the light controlled semiconductor switch to switch from a non-conducting state to a conducting state. In implementations, the one or more light sources are electrically and thermally isolated from the light controlled semiconductor switch.

In implementations, the method of use includes mounting a first heat dissipater to the housing such that the first heat dissipater draws heat away from the at least one light source; and mounting a second heat dissipater to the housing such that the second heat dissipater draws heat away from the light controlled semiconductor switch. In embodiments, the method of use includes mounting a reflector to the housing to redirect at least a portion of the light emitted by the at least one light source to another surface of the semiconductor body. In aspects of the invention, the semiconductor body comprises a photoactive layer on a substrate, and the light emitted from the at least one light source is directed toward the surface of the semiconductor body through a gap in the first electrode.

BRIEF DESCRIPTION OF THE DRAWINGS

Aspects of the present invention are described in the detailed description which follows, in reference to the noted plurality of drawings by way of non-limiting examples of exemplary embodiments of the present invention.

DETAILED DESCRIPTION

Figure 1:
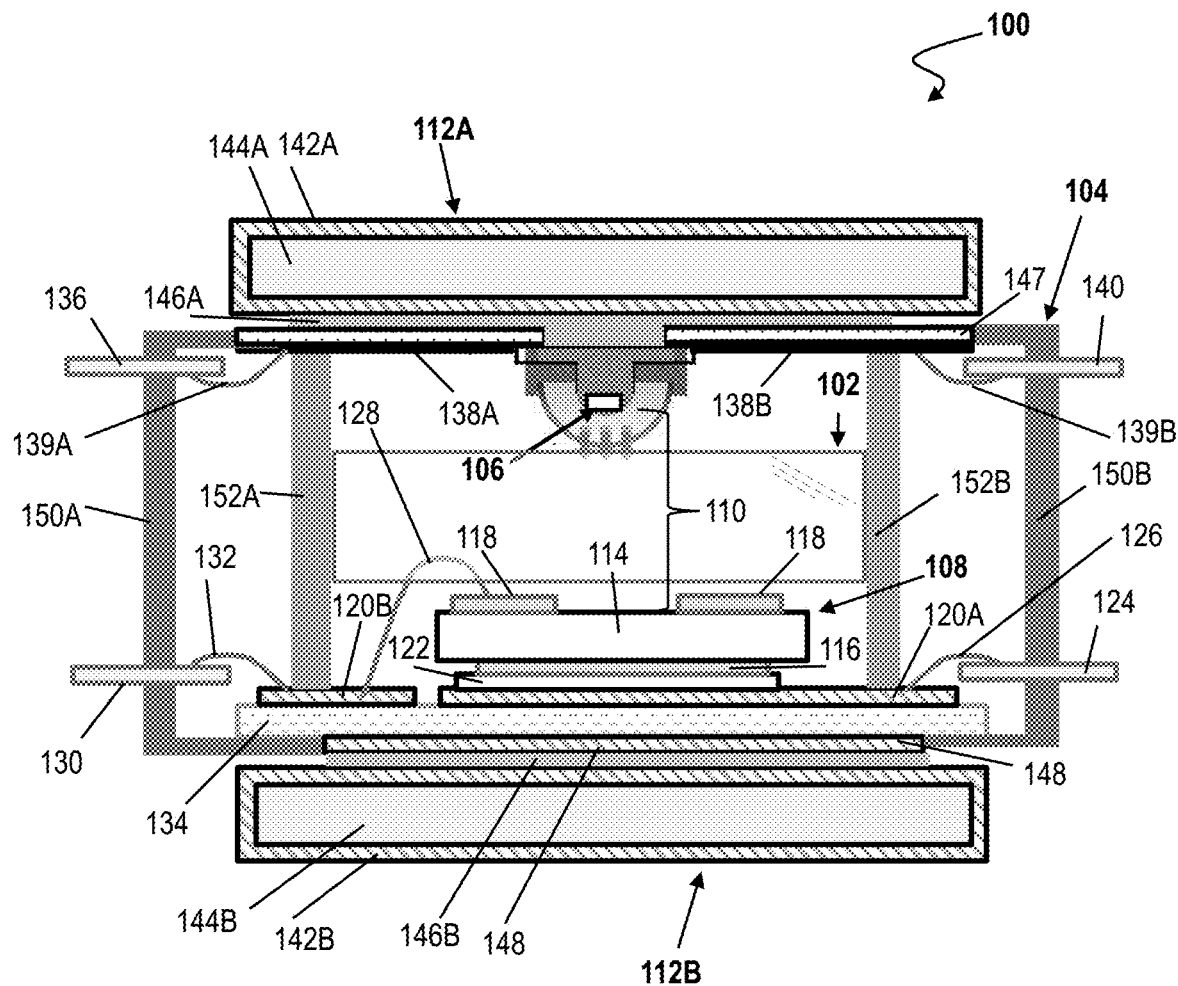
FIG. 1 depicts a side view of a light controlled switch module including an optional insulating spacer in accordance with embodiments of the invention.

Aspects of the present invention relate generally to semiconductor switches and, more particularly, to semiconductor switch modules. Embodiments of the invention provide a compact light controlled switch module including a housing holding one or more light sources in a spaced relationship from a semiconductor body of a photoconductive semiconductor switch (PCS S) or light controlled semiconductor (LCS) switch (hereafter LCS switch). In general, electricity (e.g., a low voltage) is applied to an LCS switch circuit to create free carriers below the bandgap of the semiconductor body in a non-conducting state (off state). The term bandgap as used herein refers to an energy range in a solid where no electronic states exist. In aspects of the invention, when the one or more light sources are actuated, light (photons) from the one or more light sources impinges on a semiconductor body of the LCS switch, creating a high density of free carriers within the semiconductor body, such that the free carriers exceed the bandgap of the semiconductor body and cause a current to flow through the semiconductor body in a conducting state (on state). Implementations of the invention provide for thermal and electrical isolation between the one or more light sources and the LCS switch. In aspects of the invention, an optically transparent insulating material, liquid or gas is positioned between the one or more light sources and the LCS switch. In embodiments, the light controlled switch module includes heat dissipaters mounted adjacent the one or more light sources and the LCS switch, which are configured to conduct heat away from the one or more light sources and the LCS switch.

Conventional power semiconductor device switches (e.g., a Metal Oxide Semiconductor Field Effect Transistor (MOSFET)) are fundamentally constrained by the un-modulated resistivity of a drift layer, which is required for voltage hold-off. Due to the presence of the resistivity of the drift layer in a conduction path, there is an inherent tradeoff between specific on-state resistance ($R_{ON-SP}$) and breakdown voltage ($V_{BR}$), which is represented by the following equation EQ1.

$R_{ON-SP} \propto V_{BR}^2/(\mu \varepsilon E_C^3)$, wherein where $\mu$, $\varepsilon$, and $E_C$ are mobility, permittivity, and critical field, respectively.     EQ1:

In order to achieve a higher voltage operation, doping of the drift layer must be reduced and/or the drift layer thickness must be increased, thereby increasing the $R_{ON-SP}$. This relationship is illustrated by a constant slope of $V_{BR}$ versus $R_{ON-SP}$ in a log-log plot for a particular semiconductor material. One possible avenue for technological improvements to conventional unipolar power devices is to pursue wide bandgap and ultra wide bandgap material systems such as gallium oxide ($Ga_2O_3$), aluminum nitride (AlN), cubic boron nitride (c-BN), or diamond, which all have relatively higher bandgaps than other semiconductor materials. However, such perspective emerging material systems have large technological challenges in forming high performance unipolar power devices that approach the respective theoretical figure of merit (FOM). FOMs are widely-used to compare power semiconductor materials and devices (e.g., on-resistance times gate charge).

In a conventional MOSFET, a low doped drift region provides high-voltage blocking capability that is determined by the doping and thickness of this layer. For increased blocking capability via decreased doping or increased thickness, the tradeoff is an increase in resistance of the drift region when the device is in an on-state. In order to break the tradeoff between the decreased doping/thickness and the increased resistance of the drift region, one approach is to replace the existing material of the semiconductor body with another material having a set of material parameters (mobility, permittivity, and critical field) that increases the denominator of the above equation EQ1, $\varepsilon_s \mu E_c^3$ (referred to as Baliga's figure of merit (BFM) for power devices). The BFM is a measurement of a specific on-resistance of the drift region of a vertical field effect transistor (FET).

A typical design of a MOSFET applies a voltage on a gate terminal to modulate conductivity of a region near the gate terminal, and thus modulate the entire device. An inherent property of a MOSFET semiconductor is that an electric field generated by voltage applied to the gate terminal will only significantly modify the carrier concentration in the semiconductor body within a few tens of nanometers (nm) of the gate terminal. That is, there is no functional bias voltage that can change the conductivity of a vertical drift region that extends tens or hundreds of microns in length away from the gate terminal.

Advantageously, embodiments of the invention provide a light controlled switch module having a LCS switch that, when illuminated by a light source, provides photo-generation of carriers throughout a drift region. This carrier generation throughout the drift region decouples the conductivity and breakdown relationship described above with respect to conventional MOSFETs. A simple relation photo-conductive figure of merit is provided by the following equation EQ2.

$$R_{on-sp} = \frac{V_B^2}{(1-r)\tau\varepsilon_S\mu E_c^2 Pabs},\quad \text{EQ2}$$

where τ is the lifetime and r is reflection coefficient ([0-1]).
Assuming no reflection (r=0) then this relation reduces to the following equation EQ3.

$$R_{on-sp} = \frac{V_B^2}{\tau\varepsilon_S\mu E_c^2 Pabs}.\quad \text{EQ3}$$

Gate drivers of power switches (e.g., MOSFETs) are noisy and can cause the power switch to turn on at the wrong time and cause failure of a power switch converter. Upper gate drivers for power switches are typically biased (floated) at high voltage (i.e., up to 10,000 volts (V) or higher). Gate drivers for series-connected power switches can be biased (floated) at high voltages (sometimes using transformers). Advantageously, instead of utilizing conventional electrical gate drivers, embodiments of the invention utilize one or more light sources to turn on and off an LCS switch, thus eliminating the noise problems associated with conventional electrically-controlled gate drivers. Moreover, embodiments of the invention do not require biasing gate drivers at a high voltage (the light source is at ground).

Implementations of the invention provide a compact light controlled switch module having a lower resistance than conventional power switches (e.g., MOSFETs), which are useful in high-voltage operations because of a lack of gate driver noise and because it is unnecessary to float a gate driver at a high voltage. Moreover, gate driver noise is a major problem for high voltage converters, and may cause conventional silicon carbide (SiC) switches to switch at a slower rate. Implementations of the invention have an improved switching time over conventional SiC switches.

FIG. 1 depicts a side view of a light controlled switch module (LCSM) 100 including an optional thermal barrier 102 in accordance with embodiments of the invention. In the example of FIG. 1, the LCSM 100 includes a housing 104 to which a light source 106 and a light controlled semiconductor (LCS) switch 108 are opposably mounted, with a gap 110 there between. A first heat dissipater 112A is mounted adjacent the light source 106, and is configured to conduct heat away from the light source 106. Similarly, a second heat dissipater 112B is mounted adjacent the LCS switch 108, and is configured to conduct heat away from the LCS switch 108.

Figure 3:
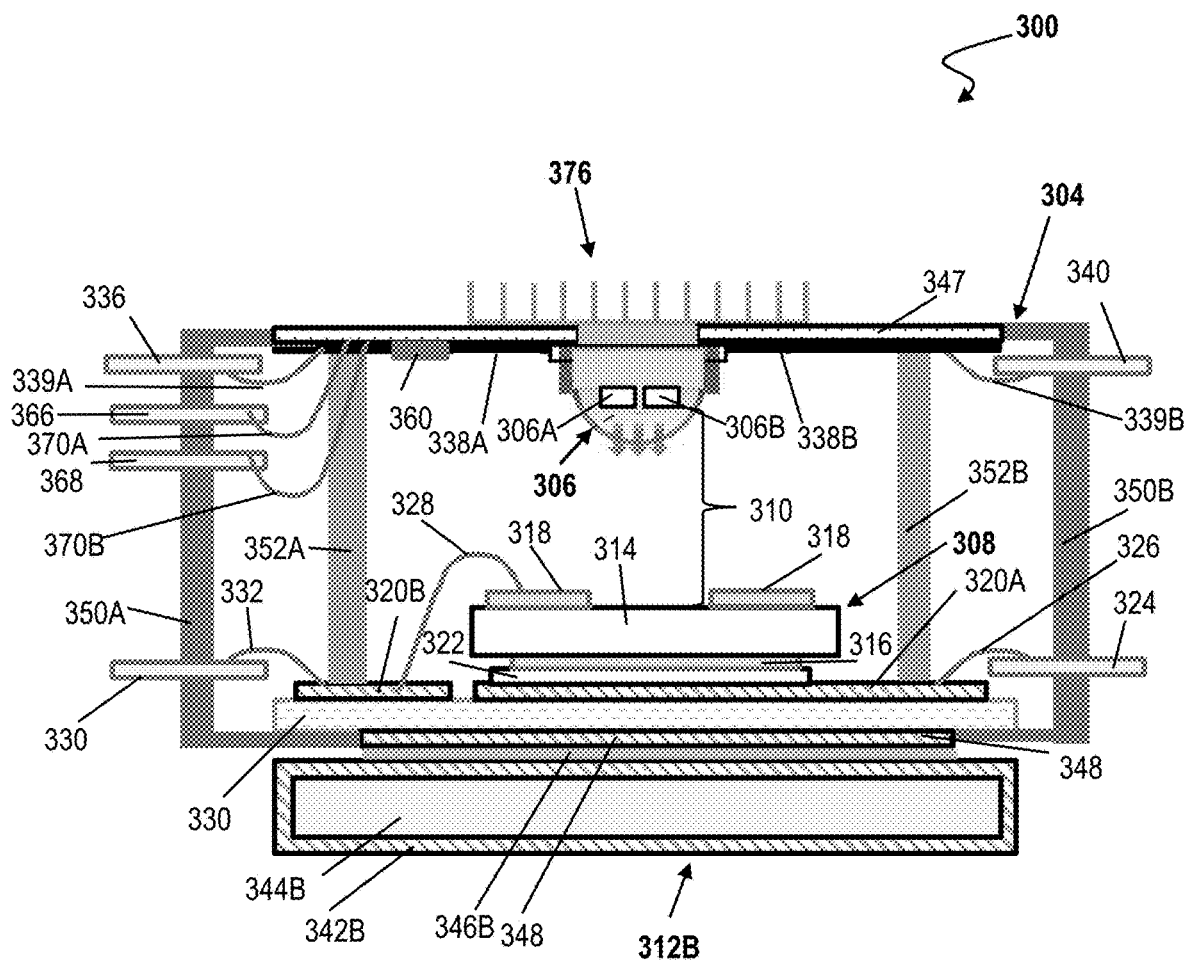
FIG. 3 depicts a side view of a light controlled switch module including a fin heat sink in accordance with embodiments of the invention.
Figure 4:
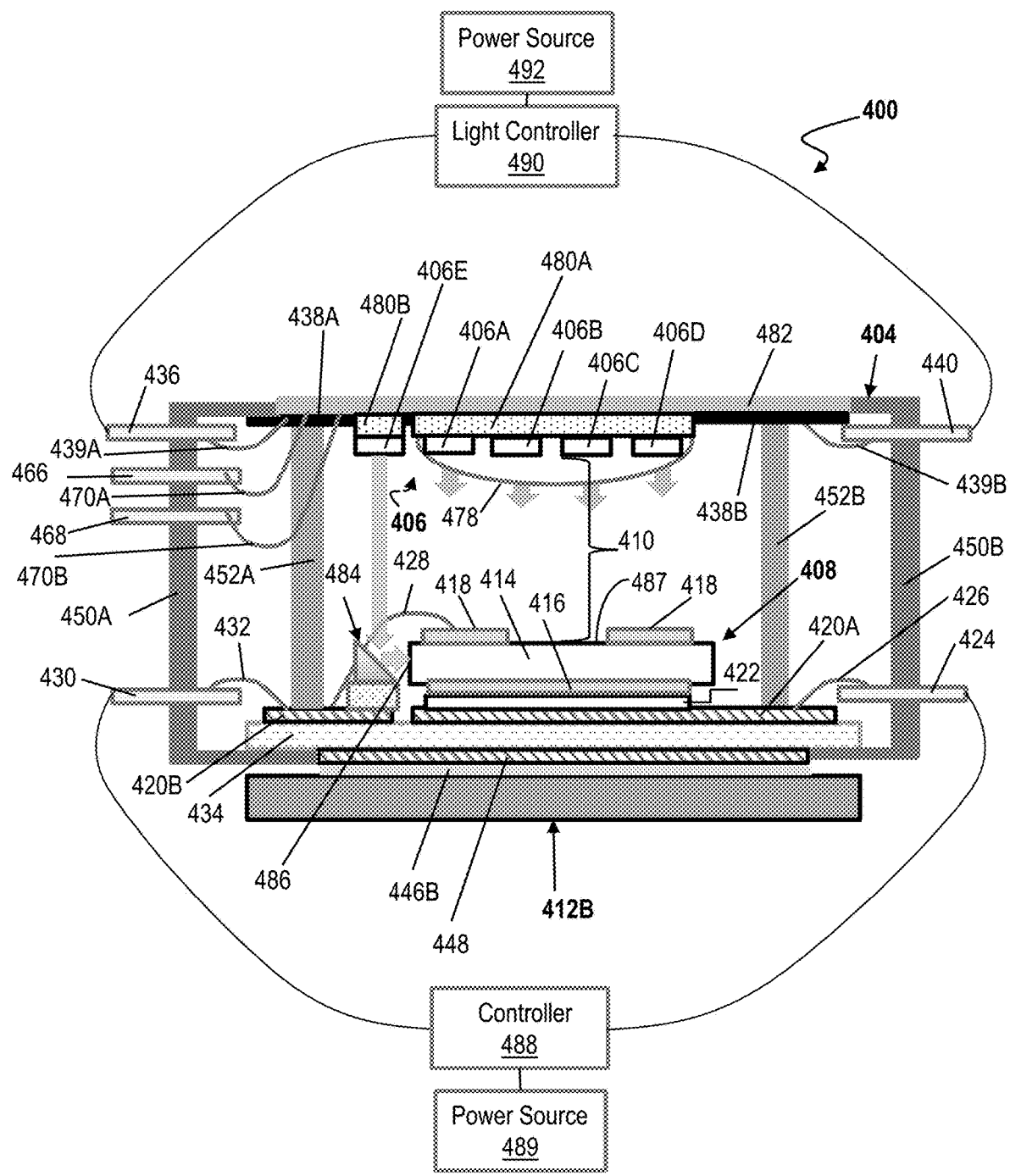
FIG. 4 depicts a side view of a light controlled switch module configured for multidirectional illumination in accordance with embodiments of the invention.

Although depicted as a light emitting diode (LED) having a lens, it should be understood that a variety of different types of light sources may be utilized as the light source 106. Light sources 106 may include, for example, LEDs without lenses, LED arrays without lenses, LEDs with lenses integrated in the LED package, LED arrays with lenses integrated in the LED array package, packages with multiple LED diodes in the package (with the LED diodes having different wavelengths), lasers, optical fibers, multi-wavelength optical fibers, optical lens arrays, or other sources. In implementations, the light source 106 comprises more than one light source (as depicted in FIGS. 3 and 4, for example). In some embodiments, LEDs can operate over a temperature range of −55° C. to 250° C. In some embodiments, LEDs can operate over a temperature range of −40° C. to 175° C. In some embodiments, LEDs can operate over a temperature range of −40° C. to 125° C. Lasers can be thermoelectric cooled to provide a state temperature for laser operation. It is noted that lasers have a smaller operating temperature range then LEDs. In implementations, the light source 106 is an LED that has an operating temperature of less than 175 C. In embodiments, the light source is an LED that has an operating temperature of less than 250 C.

In implementations, the LCS switch 108 comprises a photoconductor, light-responsive semiconductor body 114, light controlled semiconductor body 114, or light activated semiconductor body 114 positioned between an anode 116 and a cathode 118. The light-responsive semiconductor body 114 may comprise a direct bandgap crystalline material, such as carbon or iron doped gallium nitride (GaN). In implementations, the cathode 118 does not conform (in whole or in part) to the shape of the light-responsive semiconductor body 114, such that an opening or gap in the cathode 118 enables light emitted from the light source 106 to impinge on the light-responsive semiconductor body 114 from above.

In embodiments, an LCS circuit mounted to the LCSM 100 is configured to provide electricity from a current source (not shown) to the LCS switch 108. In the example of FIG. 1, a first electrically conductive layer (e.g., copper) 120A in electrical contact with the anode 116 of the LCS switch 108 (e.g., via a soldering layer 122), is electrically connected to an anode 124 of the LCS circuit (e.g., via a wire 126) mounted to the housing 104. Similarly, a second electrically conductive layer (e.g., copper) 120B in electrical contact with the cathode 116 of the LCS switch 108 (via a wire 128), is electrically connected to a cathode 130 of the LCS circuit (e.g., via a wire 132) mounted to the housing 104. In embodiments, the first and second electrically conductive layers 120A and 120B are mounted to, and electrically isolated from one another by, an insulation layer 134. In implementations, the insulation layer 134 comprises a ceramic configured to thermally and electrically isolate the respective first and second electrically conductive layers 120A, 120B from one another.

In embodiments, a light circuit mounted to the LCSM 100 is configure to provide electricity from a current source (not shown) to the light source 106 in an on-state. In the example of FIG. 1, a cathode 136 of the light circuit mounted to the housing 104 is in electrical contact with the light source 106 (e.g., via an electrical conducting layer 138A and wire 139A), and an anode 140 of the light circuit mounted to the housing 104 is in electrical contact with the light source 106 (e.g., via an electrical conducting layer 138B and wire 139B).

A variety of heat dissipaters (e.g., heat sinks) may be utilized in embodiments of the invention, and the type of heat dissipater used is not intended to be limited to the examples discussed herein. In the example of FIG. 1, the first and second heat dissipaters 112A and 112B are in the form of liquid heat sinks, each including a respective heat conductive outer layer 142A, 142B and a liquid-filled housing 144A, 144B. In implementations, the heat conductive outer layer 142A of the first heat dissipater 112A is in thermal contact with the light source 106 via a first thermally conductive attachment layer(s) 146A. With this configuration, heat generated by the light source 106 is absorbed by the first thermally conductive attachment layer(s) 146A, and the heat is conducted away from the first thermally conductive attachment layer 146A by the first heat dissipater 112A.

In implementations, thermally conductivity materials are used to transfer heat from the light source 106 to the liquid heat dissipaters 112A and cool the light source 106. In embodiments, the thermally conductivity materials are used to transfer heat from the LCS switch 108 to the liquid heat dissipaters 112B and cool the LCS switch 108. In implementation, the LCSM 100 can have two-side cooling. In implementation, the LCSM 100 can have liquid cooling to cool the LCS switch 108 and liquid cooling to cool the light source 106. In implementation, the LCSM 100 can have liquid cooling to cool the LCS switch 108 and forced air cooling to cool the light source 106. In implementation, the LCSM 100 can have forced air cooling to cool the LCS switch 108 and forced air cooling to cool the light source 106. In aspects of the invention, forced air cool will force air though metal fins connected to the light source 106 using attachment layer 146A, or through metal fins that are connected to the LCS switch 106 using attachment layer 146B. In the embodiments shown, the first thermally conductive attachment layer 146A is separated from the electrical conducting layers 138A, 138B by an insulating layer 147 (e.g., a non-conductive ceramic layer).

In implementations, the heat conductive outer layer 142B of the second heat dissipater 112B is in thermal contact with the LCS switch 108 via a second thermally conductive attachment layer(s) 146B contacting a portion of the first electrically conductive layer 120A indicated at 148. In embodiments, layers 120A, 120B, 134, and 148 comprise a direct bond copper substrate having a ceramic insulator 134. With this configuration, heat generated by the LCS switch 108 is absorbed by the first electrically conductive layer 120A, absorbed by the second thermally conductive attachment layer(s) 146B, and then conducted away from the second thermally conductive attachment layer 146B by the second heat dissipater 112B. A variety of know thermally conductive materials may be utilized in the first and second thermally conductive attachment layers 146A, 146B. With this configuration, heat generated by the light source 106 is absorbed by the first thermally conductive attachment layer(s) 146A and the heat is conducted away from the first thermally conductive attachment layer 146A by the first heat dissipater 112A.

In implementations, the housing 104 comprises multiple spacers providing electrical and/or thermal isolation between elements mounted thereto. In implementations, the thermal isolation results in a thermal conductivity between the light source(s) and the LCS switch of less than 1 Watt per meter Kelvin (W/mK). In the example of FIG. 1, the housing 104 includes outer spacers 150A, 150B made from electrically insulated material (e.g., a polymer) to which elements of the LCS circuit and the light circuit are attached. Specifically, FIG. 1 shows the LCS circuit cathode 130 and the light circuit cathode 136 mounted to opposing ends of the outer spacer 150A, and the LCS circuit anode 124 and the light circuit anode 140 mounted to opposing ends of the outer spacer 150B. Additionally, the example of FIG. 1 includes inner spacers 152A and 152B made from electrically insulated material (e.g., a polymer) mounted between elements of the LCS circuit and the light circuit. Specifically, FIG. 1 shows the inner spacers 152A and 152B mounted between the respective electrical conducting layers 138A, 138B and the respective first and second electrically conductive layers 120A, 120B. In embodiments, the light source 106 and/or LCS switch 108 are mounted internally within the housing 104 (e.g., within a volume defined by the outer elements 150A, 150B, 112A, and 112B of the housing 104).

In implementations, the housing 104 is configured to mount the light source 106 a predetermined distance 110 from a top of the semiconductor body 114 of the LCS switch 108 such that a predetermined amount of light (photons) impinges on a predetermined surface area of the semiconductor body 114 when the light source 106 is on/activated. The distance 110 may vary depending on a type and intensity of the light source 106 selected. Additionally, the distance 110 may be selected based on an amount of thermal insulation desired between the light source 106 and the LCS switch 108.

Optionally, an optically transparent a gas, solid or liquid thermal barrier is provided between the light source 106 and the LCS switch 108 and provides thermal insulation there between. In the example of FIG. 1, a thermal barrier 102 is in the form of a thermally insulating and optically transparent solid material mounted to the housing and positioned between the LCS switch 108 and the light source 106. In implementations, the thermal barrier 102 is configured to provide for a thermal conductivity of less than or equal to 1 W/mk between the light source 106 and the LCS switch 108. While the thermal barrier 102 is shown as a solid material interposed between the LCS switch 108 and the light source 106, the thermal barrier 102 could be in the form of another optically transparent insulating material, gas or liquid filling a portion of or the entirety of the gap between the LCS switch 108 and the light source 106. Insulating materials that may be interposed between the LCS switch 108 and the light source 106 (e.g., in the form of thermal barrier 102) include oil, gas, sapphire, polymers, and/or other optically transparent insulating materials.

Figure 2:
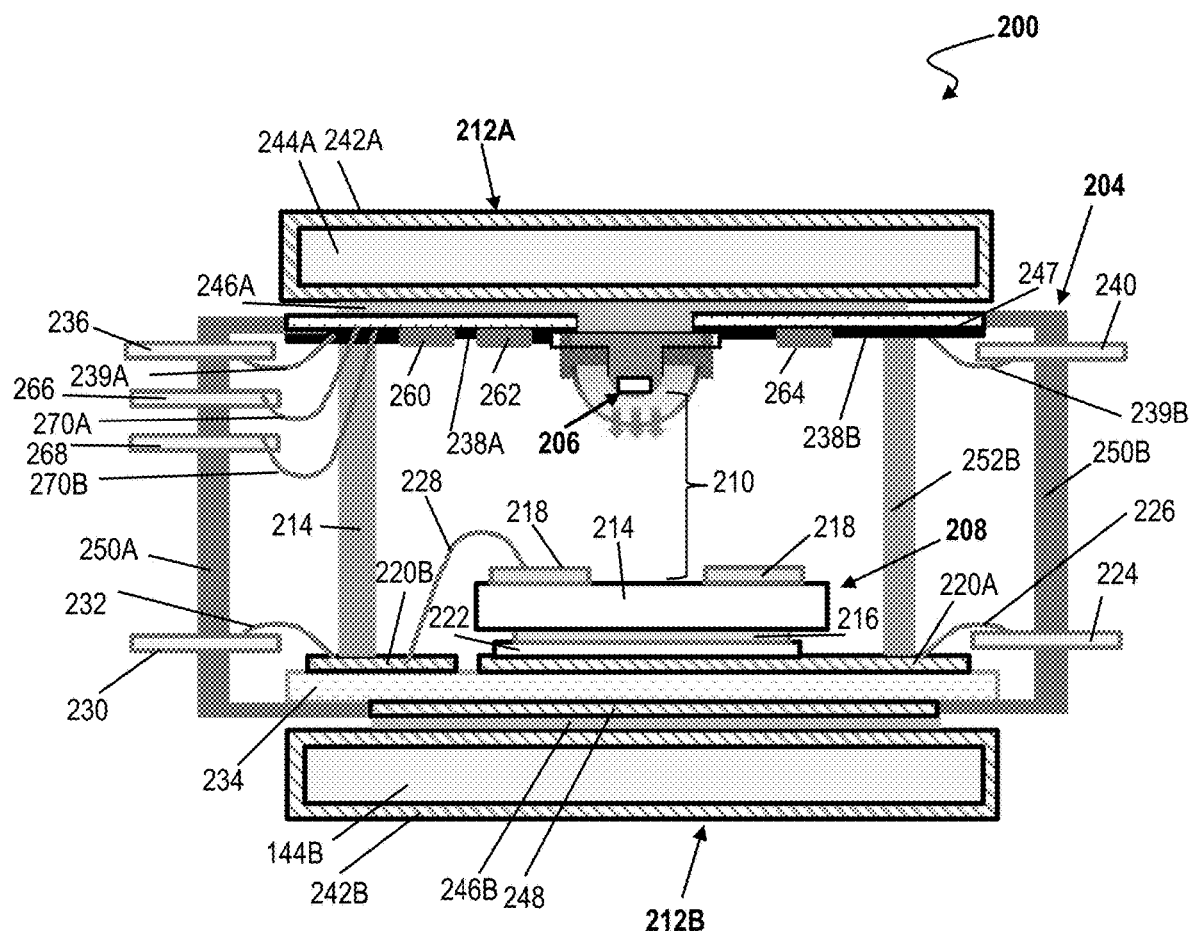
FIG. 2 depicts a side view of a light controlled switch module including a light source driver in accordance with embodiments of the invention.

FIG. 2 depicts a side view of an LCSM 200 including a light source driver 260 in accordance with embodiments of the invention. The LCSM 200 of FIG. 2 includes 200 series elements corresponding with, and have the same characteristics as, like 100 series elements of FIG. 1 (e.g., 204 corresponds to 104, etc.). Specifically, in the example of FIG. 2, the LCSM 200 includes a housing 204 to which a light source 206 and a LCS switch 208 are opposably mounted with a gap 210 there between. First and second heat dissipaters 212A, 212B are mounted adjacent to, and are configured to conduct heat away from the light source 206 and the LCS switch 208, respectively. The LCS switch 208 of FIG. 2 comprises a photoconductor or light-responsive semiconductor body 214 positioned between an anode 216 and a cathode 218.

In the example of FIG. 2, a first electrically conductive layer(s) (e.g., copper) 220A in electrically contact with the anode 216 (via a soldering layer 222), is electrically connected to an anode 224 of an LCS circuit (e.g., via a wire 226) mounted to the housing 204. Similarly, a second electrically conductive layer(s) (e.g., copper) 220B in electrically contact with the cathode 218 of the LCS switch 208 (via a wire 228), is electrically connected to a cathode 230 of the LCS circuit (e.g., via a wire 232) mounted to the housing 204. In embodiments, the first and second electrically conductive layers 220A and 220B are electrically isolated from one another by, and mounted to, an insulation layer 234 (e.g., a ceramic).

In embodiments, a light circuit mounted to the LCSM 200 is configure to provide electricity from a current source (not shown) to the light source 206. In the example of FIG. 2, a cathode 236 of the light circuit mounted to the housing 204 is in electrical contact with the light source 206 (e.g., via an electrical conducting layer 238A and wire 239A), and an anode 240 of the light circuit mounted to the housing 204 is in electrical contact with the light source 206 (e.g., via an electrical conducting layer 238B and wire 239B). In implementations, the electrodes of the LC SM 200 comprise low impedance contacts.

First and second heat dissipaters 212A and 212B are in the form of liquid heat sinks, each including a respective heat conductive outer layer 242A, 242B and a liquid-filled housing 244A, 244B. The heat conductive outer layer 242A of the first heat dissipater 212A is in thermal contact with the light source 206 via a first thermally conductive attachment layer(s) 246A. In the embodiments shown, the first thermally conductive attachment layer(s) 246A is separated from the electrical conducting layers 238A, 238B by an insulating layer 247 (e.g., non-conductive ceramic). In implementations, the heat conductive outer layer(s) 242B is in thermal contact with the LCS switch 208 via a second thermally conductive attachment layer(s) 246B contacting a portion of the first electrically conductive layer(s) 220A indicated at 248.

Housing 204 has the same construction as housing 104 of FIG. 1, and includes outer spacers 250A, 250B and inner spacers 252A and 252B to which elements of the LCS circuit and the light circuit are attached. As with housing 104, housing 204 is configured to mount the light source 206 a predetermined distance 210 from a top of the semiconductor body 214. The distance 210 may vary depending on a type and intensity of the light source 206 selected, and an amount of thermal insulation desired between the light source 206 and the LCS switch 208.

In contrast to the light circuit of FIG. 1, the exemplary light circuit of FIG. 2 further includes the light source driver 260, an optional field-effect transistor (FET) switch 262, a current limiting resistor circuit (and optionally a current pull out circuit) 264, a gate driver input 266, and a gate driver drain power voltage (VDD) bus 268 in electrical communication with the light source 208 (e.g., via electrical conducting layers 238A, 238B or wires 270A, 270B). In implementations, the light source driver 260 comprises an electronic circuit that generates a constant output current from a supply voltage, wherein the constant output current is output to the light source 208. In implementations, the FET switch 262 is configured to control on and off states of the light source 208. In embodiments, the current limiting resistor circuit 264 is connected in series with the light source and is configured to limit current and protect the light source from excessive current. In aspects of the invention, a current pull out circuit is incorporated with the current limiting resistor circuit and is configured to ensure a known state for a signal. In implementations, the gate driver input 266 is configured to accept a low power input and produce an appropriate current gate drive. In embodiments, the gate driver drain power voltage (VDD) bus 268 is configured to communicate data between the gate drive input 266 and the light source driver 260.

FIG. 3 depicts a side view of an LCSM 300 including a fin-type heat sink (heat dissipater) 376 in accordance with embodiments of the invention. The LCSM 300 of FIG. 3 includes 300 series elements corresponding with, and have the same characteristics as, like 200 series elements of FIG. 2 (e.g., 204 corresponds to 304, etc.). Specifically, in the example of FIG. 3, the LCSM 300 includes a housing 304 to which a light source 306 (comprising LEDs 306A and 306B) and a LCS switch 308 are opposably mounted with a gap 310 there between. A first heat dissipater 376 and a second heat dissipater 312B are mounted adjacent to, and are configured to conduct heat away from, the light source 306 and the LCS switch 308, respectively. In the embodiment of FIG. 3, the first heat dissipater 376 is in the form of a fin-type heat sink. In the embodiments shown, the first heat dissipater 376 is separated from the electrical conducting layers 338A, 338B by an insulating layer 347 (e.g., a non-conductive ceramic). The LCS switch 308 of FIG. 3 comprises a photoconductor or light-responsive semiconductor body 314 positioned between an anode 316 and a cathode 318.

In the example of FIG. 3, a first electrically conductive layer (e.g., copper) 320A in electrically contact with the anode 316 (via a soldering layer 322), is electrically connected to an anode 324 of an LCS circuit (e.g., via a wire 326) mounted to the housing 304. Similarly, a second electrically conductive layer (e.g., copper) 320B in electrically contact with the cathode 318 of the LCS switch 308 (via a wire 328), is electrically connected to a cathode 330 of the LCS circuit (e.g., via a wire 332) mounted to the housing 304. In embodiments, the first and second electrically conductive layers 320A and 320B are electrically isolated from one another by, and mounted to, an insulation layer 334 (e.g., a ceramic).

In embodiments, a light circuit mounted to the LCSM 300 is configure to provide electricity from a current source (not shown) to the light source 306. In the example of FIG. 3, a cathode 336 of the light circuit mounted to the housing 304 is in electrical contact with the light source 306 (e.g., via an electrical conducting layer 338A and wire 339A), and an anode 340 of the light circuit mounted to the housing 304 is in electrical contact with the light source 306 (e.g., via an electrical conducting layer 338B and wire 339B).

The exemplary second heat dissipater 312B is in the form of a liquid heat sink, including a heat conductive outer layer 342B and a liquid-filled housing 344B. In implementations, the heat conductive outer layer 342B is in thermal contact with the LCS switch 308 via a second thermally conductive attachment layer(s) 346B contacting a portion of the first electrically conductive layer 320A indicated at 348.

Housing 304 has the same construction as housings 104 and 204 of FIGS. 1 and 2, and includes outer spacers 350A, 350B and inner spacers 352A and 352B to which elements of the LCS circuit and the light circuit are attached. Housing 304 is configured to mount the LEDS 306A, 306B of the light source 306 a predetermined distance 310 from a top of the semiconductor body 314.

The exemplary light circuit of FIG. 3 also includes an optional light source driver 360, gate driver input 366, and gate driver drain power voltage (VDD) bus 368 in electrical communication with the light source 306 (e.g., via electrical conducting layer 338A or wires 370A, 370B).

FIG. 4 depicts a side view of an LCSM 400 configured for multidirectional illumination in accordance with embodiments of the invention. The LCSM 400 of FIG. 4 includes 400 series elements corresponding with, and have the same characteristics as, like 300 series elements of FIG. 3 (e.g., 404 corresponds to 304, etc.). Specifically, in the example of FIG. 4, the LCSM 400 includes a housing 404 to which a light source 406 (comprising multiple light sources 406A-406E) and a LCS switch 408 are opposably mounted with a gap 410 there between. Optionally, a lens 478 is located between the light sources 406A-406E and the LCS switch 408. In the example of FIG. 4, light sources 406A-406D are mounted to the housing 404 by a substrate support 480A attached to a housing length 482, and light source 406E is separately mounted to the substrate support 480 by a substrate support 480B. The LCS switch 408 of FIG. 3 comprises a photoconductor or light-responsive semiconductor body 414 positioned between an anode 416 and a cathode 418.

In the example of FIG. 4, a first electrically conductive layer(s) (e.g., copper) 420A in electrically contact with the anode 416 (via a soldering layer 422), is electrically connected to an anode 424 of an LCS circuit (e.g., via a wire 426) mounted to the housing 404. Similarly, a second electrically conductive layer(s) (e.g., copper) 420B in electrically contact with the cathode 418 of the LCS switch 408 (via a wire 428), is electrically connected to a cathode 430 of the LCS circuit (e.g., via a wire 432) mounted to the housing 404. In embodiments, the first and second electrically conductive layers 420A and 420B are electrically isolated from one another by, and mounted to, an insulation layer 434 (e.g., a ceramic).

In embodiments, a light circuit mounted to the LCSM 400 is configure to provide electricity from a current source (e.g., power source 492) to the light sources 406A-406E. In the example of FIG. 4, a cathode 436 of the light circuit mounted to the housing 404 is in electrical contact with the light sources 406A-406E (e.g., via an electrical conducting layer 438A and a wire 439A), and an anode 440 of the light circuit mounted to the housing 404 is in electrical contact with the light sources 406A-406E (e.g., via an electrical conducting layer 438B and wire 439B).

The heat dissipater 412B is in thermal contact with the LCS switch 408 via a second thermally conductive attachment layer(s) 446B contacting a portion of the first electrically conductive layer 420A indicated at 448. Housing 404 includes outer spacers 450A, 450B and inner spacers 452A and 452B to which elements of the LCS circuit and the light circuit are attached. Housing 404 is configured to mount the light sources 406A-406E a predetermined distance 410 from a top of the semiconductor body 414.

The exemplary light circuit of FIG. 4 includes an optional gate driver input 466, and gate driver drain power voltage (VDD) bus 468 in electrical communication with the light sources 406A-406E (e.g., via electrical conducting layer 438A or wires 470A, 470B). In implementations, the LCSM 400 includes a reflector (e.g., a mirror or right-angle polarizer) 484 electrically isolated from circuit components of the LCSM 400 and positioned to re-direct light emitted from at least one of the light sources 406A-406E to a side portion 486 of the semiconductor body 414 of the LCS switch 408. In the exemplary configuration of FIG. 4, light emitted from light sources 406A-406D impinges on an exposed top portion 487 of the semiconductor body 414, while light emitted from the light source 406E is re-directed 90 degrees by the reflector 484 to impinge on the side portion 486 of the semiconductor body 414. Implementations of the multi-directional light impingement configuration of FIG. 4 reduce a time period for activating a current within the LCS switch 408 as compared to equivalent uni-directional configurations.

It should be understood that elements of the LCSMs of FIGS. 1-4 may be combined in different combinations and configurations than those shown, and the invention is not intended to be limited to the specific examples shown in FIGS. 1-4.

Method of Use

A method of use will now be discussed with reference to FIG. 4. In embodiments, a controller 488 is configured to control the flow of power from a power source 489 to the cathode 430 and the anode 424, and from the cathode 430 and anode 424 to the respective cathode 418 and the first electrically conductive layer 420A. The current applied to the first electrically conductive layer 420A flows to the anode 416. Voltage flowing between the power source 489 and the anode 416 and cathode 418 generates an electric field through the semiconductor body 414. In implementations, a light controller 490 is configured to control the flow of power from a power source 492 (which may be the same as the power source 489) to the cathode 436 and the anode 440, which supplies power to the light sources 406 to actuate the light sources to output light. Light impinging on the semiconductor body 414 supplies the triggering energy (e.g., photon energy) needed to switch the LCS switch 408 from an "off" state (non-conducting state) to an "on" state (conducting state). More specifically, when the light energy is sufficient to raise electrons within the semiconductor body 414 above a bandgap energy of the semiconductor body 414, the LCS switch 408 switches from a non-conducting state to an "on" state wherein electrical current flows through the LCS switch 408. The same method may apply to other exemplary LCS switches discussed herein.

The semiconductor body 414 includes electron traps, which can capture and immobilize an electron to prevent its recombination with a carrier of opposite charge as an electron-hole pair. Carriers that are trapped at states within the band gap can reside in the trap after the light is turned off. In embodiments, a LCS switch (e.g., 108, 208, 308, or 408) is reverse biased to speed up the depopulation of charge that is trapped in states within the bandgap of the semiconductor body (e.g., 114, 214, 314, or 414). For example, the negative terminal of the voltage supply may be connected to the p-type region (e.g., GaN substrate) and the positive terminal of the voltage supply may be connected to the n-type region (e.g., GaN:C layer) to reverse bias the LCS switch.

Light Controlled Semiconductor (LCS) Switch

Embodiments of the invention, such as the exemplary embodiments of FIGS. 1-4, may be made using a variety of techniques. In implementations, LCSMs (e.g., LCSM 100, 200, or 300) may be implemented with a vertical LCS switch, a lateral LSC switch in which light from a light source impinges on a side of a semiconductor material, or a multi-directional LCS switch (e.g., 400) wherein light from light sources impinges on a top and side(s) of the light controlled switch. In implementations, a distance (e.g., 110, 210, 310, or 410) between one or more light sources (e.g., 106, 206, 306, or 406A-E) and a surface of a semiconductor body (e.g., 114, 214, 314, or 414) provides electrical isolation greater than the operating voltage of the LCS switch. For example, the electric isolation provided by distance 110, 210, 310 and or 410 of FIGS. 1-4 may be 20 kilovolts (kV) for a 10 kV LCS switch or 80 kV for a 40 kV LCS switch.

In implementations, an LCS switch (e.g., 108, 208, 308, or 408) blocks high voltage in the dark (off-state), turns on with low resistance under illumination (on-state), and switches between the on and off states quickly. In embodiments, the LCS switch has a voltage blocking capability in an off state more than: 100 volts (V), 200 V, 500 V, 1000 V, 1700 V, 3300 V, 4500 V, 6500 V, 10000 V, 20000 V, or 40000 V. Voltage blocking (sometimes referred to as blocking voltage) refers to the ability of a semiconductor device to prevent the flow of current in one direction. In implementations, the LCS switch (e.g., 108, 208, 308, or 408) has an on-resistance of: 5 milliohms (mΩ), 10 mΩ, 15 mΩ, 20 mΩ, 50 mΩ, 100 mΩ, 200 mΩ, 500 mΩ, 1000 mΩ, 2000 mΩ, or 5000 mΩ. In some embodiments, the leakage current of the light-controlled switch (e.g., 108, 208, 308, or 408) in the off state is: less than $1 \times 10^{-11}$ amperes (A), less than $1 \times 10^{-9}$ amperes (A), less than $1 \times 10^{-6}$ A, less than $1 \times 10^{-4}$ A, or less than $1 \times 10^{-3}$ A. In embodiments, when utilized for power switching applications, the LCS switch is configured to have a lowest on-resistance compatible with a size and power dissipation of a light source (e.g., 106, 206, 306, or 406A-E). In embodiments, when utilized for radio frequency and microwave applications, the LCS switch is configured to have a low on-resistance compared to a resistance of a 50 ohm electrical input transmission line.

In embodiments, an LCS switch (e.g., 108, 208, 308, or 408) operates based on the principle of electrical conductivity modulation due to optical generation of free excess carriers in the conduction and/or valance band of a semiconductor body (e.g., 114, 214, 314, or 414) by incident light. In solid-state physics, the valence band and conduction band are the bands closest to the Fermi level, and thus determine the electrical conductivity of the solid. In nonmetals, the valence band is the highest range of electron energies in which electrons are normally present at absolute zero temperature, while the conduction band is the lowest range of vacant electronic states. The equation for electrical conductivity in a semiconductor as a function of free excess carriers is provided in the following equation EQ3:

$\sigma = q(\mu_e n + \mu_h p)$, where $\mu_e$ and $\mu_h$ are the electron mobility and hole mobility, respectively, and $n$ and $p$ are the electron and hole free excess carrier density.     EQ3:

The LCS switch (e.g., 108, 208, 308, or 408) may be an intrinsic light-controlled switch or an extrinsic light-controlled switch. An extrinsic light-controlled switch uses traps with energies within the bandgap of the semiconductor body (e.g., 114, 214, 314, or 414) for switch operation. In general, a trap is any location within a solid (e.g., semiconductor or insulator) that restricts movement of electrons and holes (i.e., equivalent positive electrical charges that result from an absence of an electron within a crystal structure). The traps with energies within the bandgap serve two purposes for an extrinsic light-controlled switch. First, the traps act as carrier recombination centers that will annihilate carriers generated by shallow dopants in the semiconductor body that will increase the resistivity of the semiconductor body and, at a sufficiently high level of traps, will make the semiconductor body semi-insulating with resistivity values in excess of about $10^9$ ohms centimeter (ohm-cm) and as high as about $10^{11}$ ohm-cm.

A second purpose for the traps is to operate as photo-generation centers to generate free excess carriers within the conduction band and/or the valance band. Traps with the characteristic to produce excess free carriers in the conduction or valance band when illuminated with photons are photoactive traps. Traps that do not produce excess free carriers in the conductor or valance band when illuminated with photons are non-photoactive traps. Energy loss mechanisms such as phonon generation can make a trap non-photoactive. It has been experimentally demonstrated that carbon dopant in gallium nitride (GaN) produces a photoactive trap for carbon dopant. The traps generated by carbon doping are very photoactive for carbon doping less than about $10^{18}$ cm$^{-3}$ dopant concentration. Carbon traps can be photoactive with carbon doping to about $5 \times 10^{19}$ cm$^{-3}$ dopant concentration, but the photoactivity may be reduced. Iron dopant in GaN produces traps that are non-photoactive or very weakly photoactive for high concentrations of iron. GaN with carbon doping has four orders-of-magnitude higher photoresponsivity than GaN doped with iron.

In implementations, dopants are incorporated within the semiconductor body (e.g., 114, 214, 314, or 414) of an extrinsic light-controlled switch to create traps with energies within the bandgap of the semiconductor body material. Dopants that create traps with energies within the bandgap of the semiconductor body material include carbon, carbon-hydrogen complexes, and magnesium-hydrogen complexes.

The recombination (annihilation) of excess carriers in the conduction or valance band in a semiconductor body (e.g., 114, 214, 314, or 414) may take place via different recombination mechanisms. There are three basic recombination mechanisms that are responsible for carrier annihilation in a semiconductor body or compensation of free excess carrier created by shallow donors or acceptors. They are (1) non-radiative recombination at traps with energy levels within the bandgap (i.e., the multiphonon process), (2) band-to-band radiative recombination, and (3) Auger band-to-band recombination.

In implementations, an extrinsic light-controlled switch can use light with photon energies larger than the bandgap of the semiconductor body (e.g., 114, 214, 314, or 414), but can also use light with photon energies less than the bandgap energy of the semiconductor body to generate free excess carriers. Photons with a photon energy less than the bandgap of the semiconductor body can be absorbed by traps at energies within the bandgap of the semiconductor body, and excite electrons into the conduction band or holes into the valance band. In implementations, the generation of excess electrons carriers or excess hole carriers provide electrical conductivity modulation.

One characteristic of the traps at energies within the bandgap of the semiconductor body (e.g., 114, 214, 314, or 414) that can affect the performance of an extrinsic light-controlled switch is whether the traps have the characteristic radiative traps or non-radiative traps. Non-radiative traps have the characteristic that the energy is dissipated in the form of phonons rather than photon emission. There is a general corresponding characteristic that traps that are poor for photon generation (nonradiative traps) are also poor for photogeneration of free excess carriers. The characteristic of traps at energies within the bandgap can change depending on the concentration of a dopant generated trap. For example, traps induced by carbon doping in GaN can be radiative for low concentrations of carbon but become non-radiative for high level of carbon doping.

An intrinsic light-controlled switch uses photons with an energy larger than the bandgap of the semiconductor body (e.g., 114, 214, 314, or 414) to generate free excess carriers. Light with a photon energy greater than the bandgap of the semiconductor body will excite electrons from the valance band to the conduction band of the semiconductor body, generating free excess electron carriers in the conduction band and a corresponding hole carrier in the valance band. The photogeneration of excess electron carriers and excess hole carriers provide electrical conductivity modulation.

An LCS switch (e.g., 108, 208, 308, or 408) according to embodiments of the invention can be configured to operate with a low injection of photogenerated electron carriers or a high injection of photogenerated electron carriers (the excess electron carrier concentration is much greater than the equilibrium density) region of operation. The low injection of photogenerated carriers typically has a free carrier density less than $5 \times 10^{16}$ free excess carrier per cubic centimeter (cm$^{-3}$) and a high injection of photogenerated carriers has a free carrier density higher than $5 \times 10^{16}$ cm$^{-3}$. The carrier mobility is degraded for operation under high injection. The light-controlled switch can operate in a high injection region of operation but higher levels of free excess carriers and thus optical power will be required for the same resistivity as obtainable in a low injection condition because the electron carrier mobility is degraded under high injection conditions. Approaches to lower the free excess carrier density for a given optical power level include making the device area larger. To increase the area and thus lower the carrier density for a lateral light-controlled switch, the perimeter of the anode (e.g., 116) and cathode (e.g., 118) can be increased. In implementations, a lateral LCS switch (e.g., 108) is implemented in an interdigitated design of the anode and cathode electrodes. In embodiments, a lateral LSC switch is designed with a predetermined separation between the anode and cathode electrodes in an interdigitated design. In implementations using multiple levels of metal with contact between the metal levels, other design arrangements for the anode and cathode electrodes other than interdigitated designs may be utilized.

In implementations, in order to create photogeneration of free carriers within the semiconductor body (e.g., 114, 214, 314, or 414), one or more transparent electrodes are utilized to prevent shadowing of the semiconductor body from an upper electrode(s) (e.g., the upper cathode 118). In embodiments, wide bandgap, transparent conductive oxides are utilized, and allow for an ohmic contact to the LCS switch (e.g., 108, 208, 308, or 408), while passing the necessary wavelength light through the semiconductor body. Although photons will create equal number of electron-hole pairs, under bias in the on-state, an LCS switch of the invention may be dominated by electron transport in the on-state, as the electron mobility is larger than the hole mobility and the electron lifetime is longer than the hole lifetime. Drawing from the transparent electrodes, more electrons will contribute to current flow than holes; therefore the transparent electrodes should form an ohmic contact to an n-type material of a semiconductor body (e.g., 114, 214, 214, or 414). In implementations, a gridded thick metal type anode (e.g., 116, 216, 216, or 416) can be utilized to reduce contact resistance further.

Semiconductor Body

The above equation EQ 3 indicates that the conductivity and thus the resistance of an LCS switch (e.g., 108, 208, 308, or 408) depends strongly on the mobility of the electron and hole carriers within the semiconductor body (e.g., 114, 214, 314, or 414) and the concentration of free excess electron and/or hole carriers in the conduction and valance bands of the semiconductor body. For above-bandgap light, the concentration of free carriers in a semiconductor body depends on the band-to-band light absorption characteristics and the recombination lifetime of excess carriers in the conduction and valance bands. For sub-bandgap light, the concentration of free carriers in the semiconductor body depends on the trap emission characteristics of the traps illuminated with photons with sub-bandgap photon energies (photogeneration of excess carriers from traps with energies within the bandgap) and the recombination lifetime of excess carriers in the conduction and valance bands.

The mobility of the free excess carriers can be degraded by dislocations and defects in the semiconductor body material(s). Thus, approaches to reduce the dislocations and defects may be implemented for light-controlled switches. In implementations, a semiconductor body (e.g., 114, 214, 314, or 414) of an LCS switch (e.g., 108, 208, 308, or 408) is built using homoepitaxial growth of a III-N semiconductor layer on an III-nitride substrate to reduce dislocation and defect densities. The homoepitaxial growth of GaN on a best GaN substrate results in defect levels of about 1e3 cm$^{-2}$ to about 1e5 cm$^{-2}$. Homoepitaxial growth of GaN on conventional GaN substrates results in a defect density of 1e5 cm$^{-2}$ to 1e7 cm$^{-2}$. GaN heteroepitaxial growth on silicon carbide (SiC) results in a defect density of about 1e7 cm$^{-3}$ to 1e10 cm$^{-3}$.

The generation of excess electrons carriers and excess hole carriers provide electrical conductivity modulation. As indicated by the conductivity equation EQ3 above, the generation of free excess carriers is related to achieving low on-resistance. Photogeneration in a semiconductor is generally described by the following equation EQ4:

$G = \eta_0 P \lambda / hc \, e^{-\alpha y}$, where $G$ is photogeneration rate, $P$ is the (local) light intensity, $\eta_0$ is the internal quantum efficiency (for excess carriers generated per photon absorbed), $\alpha$ is the absorption coefficient. EQ4:

Wide bandgap and ultra-wide bandgap semiconductors materials provide high critical electric field strength, high carrier mobility, and high carrier saturation velocity. Wide bandgap and ultra-wide bandgap semiconductor materials can have a direct bandgap or an indirect bandgap. An example of a wide bandgap semiconductor material having an indirect bandgap is SiC.

Wide bandgap and ultra-wide bandgap semiconductor materials that have a direct bandgap include GaN, AlN, and $Al_xGa_{1-x}N$. Such materials have significant advantages for a light controlled switch device, as they provide high critical electric field strength, high carrier mobility, high saturation velocity, and strong absorption of light. In addition, by being direct bandgap semiconductors, these materials can absorb light near, at, or above bandgap energies, creating a high-density of free excess carriers in the conduction band and/or valance band using only photons. A direct bandgap semiconductor may be preferable since the presence of an indirect transition limits the efficiency of free carrier generation. A direct bandgap semiconductor light-controlled switch will thus require a significantly smaller light source to generate free excess carriers, allowing for a size weight and power (SWaP) favorable compact device.

In implementations, a dopant within the semiconductor body (e.g., 114, 214, 314, or 414) that generates traps at energies within the bandgap of the semiconductor body can be selected to minimize persistent photoconductivity. The semiconductor body can also be optimized to minimize persistent photoconductivity. In embodiments, a semiconductor body with larger grain size or fewer grain boundaries will have lower levels of persistent photoconductivity.

In embodiments, a low resistance, high blocking voltage LCS switch (e.g., 108, 208, 308, or 408) is provided including a semiconductor body (e.g., 114, 214, 314, or 414) generated by epitaxially growing a semiconductor layer of GaN on a semi-insulating SiC substrate utilizing a nucleation layer. Optionally, an initial P-type layer of GaN is grown on the nucleation layer to act as an electric field shield to prevent an electric field from extending into the SiC substrate and permitting a leakage path between an anode (e.g., 116, 216, 316, or 416) and cathode (118, 218, 318, or 418) at a voltage more than approximately 2 kV.

The coefficient of thermal expansion difference of GaN and SiC limit how thick the GaN layer can be grown without cracking in the GaN layer. In implementations, the GaN epitaxial layer is in the range of 200 nm to about 5 microns (μm) in thickness. In implementations, the GaN material is doped with a dopant that generates traps with energy levels within the bandgap of the GaN layer to compensate the N-type dopant or P-type dopant of the GaN layer to achieve a high resistivity GaN material with a resistivity of more than $1 \times 10^7$ ohm-cm and as high as $1 \times 10^{11}$ ohm-cm.

In implementations, the dopant and the concentration of the dopant that generates trap energies within the bandgap of the semiconductor body (e.g., 114, 214, 314, 414) is also selected to have good photogeneration of free excess carriers' capability. The dopant and dopant concentration and complexes with the dopant will typically be selected to have radiative properties with less preference for dopants and dopant concentration and complexes that have nonradiative properties. In implementations, semiconductor body dopants include carbon, carbon-hydrogen, magnesium-hydrogen, and iron. Carbon dopant with a doping concentration of approximately $10^{17}$ cm$^{-3}$ has been experimentally shown to have excellent free excess carrier generation characteristics.

AlN or aluminum gallium nitride (AGaN) has a high breakdown strength than GaN. In implementations, the semiconductor body (e.g., 114, 214, 314, or 414) includes an AlN or AGaN layer epitaxially grown on a SiC substrate (using a nucleation layer) that can provide a barrier to current flow into the SiC substrate.

In alternative embodiments, a low resistance, high blocking voltage LCS switch (e.g., 108, 208, 308, or 408) is provided including a semiconductor body (e.g., 114, 214, 314, or 414) generated by epitaxially growing a semiconductor layer of GaN on a semi-insulating or conductive GaN substrate. One advantage of an LCS switch that uses GaN homoepitaxial growth on a GaN substrate is that there is not a thermal coefficient of expansion limitation on how thick the GaN epitaxial layer can be grown, and in the case that a semi-insulating GaN substrate is used, there is not a leakage path from anode (e.g., 116, 216, 316, or 416) to cathode (e.g., 118, 218, 318, or 418) through the substrate body material. In implementations, the GaN epitaxial layer is doped with a dopant to provide high blocking voltage and high photogeneration as described above.

Passivation of a semiconductor body surface (i.e., coating the material to become "passive") may be utilized to achieve a high blocking voltage in an LCS switch (e.g., 108, 208, 308, or 408) of the present invention. Passivation dielectrics that may be utilized in accordance with embodiments of the invention include: silicon oxide (SiO or SiO2), silicon nitride (SiN), or AlN. In implementations, a dielectric material is deposited on a surface of the semiconductor body (e.g., 114, 214, 314, or 414) using plasmas with low energy ions to minimize defect creation within the surface region of the semiconductor material. In embodiments, the plasma ion energy is less than 100 electronvolt (eV) to minimize damage to the III-nitride surface. An optimized dielectric passivation can achieve an electric field between anode and cathode contacts (e.g., 116, 118) of an LCS switch of more than 160 volts per centimeter (V/cm) without breakdown, and in an optimized dielectric passivation can achieve 530 V/cm for a GaN LCS switch.

In implementations, a semiconductor body substrate for an LCS switch can be optimized for thermal conductivity using known approaches such as thinning and incorporating diamond material into the semiconductor body substrate. In implementations, lateral geometry (top-to-top) LCSMs (e.g., 100, 200, 300, or 400) can be optimized with interdigitated fingers to realize higher current density and reduce die size.

Vertical LCS switches (e.g., 108) may offer higher power density than lateral LCSMs (not shown). However, design and realization of a vertical LCS switches pose some challenges, such as the ability to grow thick enough layers to support a desired voltage hold-off while maintaining high quality.

In embodiments, the semiconductor body (e.g., 114, 214, 214, or 414) includes a light absorbing semiconductor layer where free excess carriers are created, which is epitaxially grown on a thick low doped N-type drift layer. The light absorbing can be within an intrinsic or extrinsic free excess carrier photogeneration region of the semiconductor body. In implementations, the light absorbing semiconductor layer is optimized for free excess carrier generation and the thick low doped N-type layer is optimized for blocking voltage and low resistance. In embodiments, a light absorbing layer of an LCS switch (e.g., 108, 208, 308, or 408) is used to inject charge into a low doped N-type drift layer of the LCS switch to turn on the LCSM (e.g., 100, 200, 300, or 400). Such drift layers may be a homojunction or heterojunction and may be engineered to achieve desired performance metrics. The term homojunction as used herein refers to a semiconductor interface that occurs between layers of similar semiconductor material; where the materials have equal band gaps but typically have different doping. In contrast, the term heterojunction as used herein refers to an interface between two layers or regions of dissimilar semiconductor materials having unequal band gaps. In one exemplary embodiment, the semiconductor body (e.g., 114, 214, 314, or 414) comprises a carbon doped gallium nitride (GaN:C) or N-type GaN epitaxial layer grown on an N-type GaN drift layer.

Light Sources

Various light sources (e.g., 106, 206, 306, and 406A-E) may be utilized for optical gating of an LCS switch (e.g., 108, 208, 308, or 408) of the present invention. In implementations, an LCS switch of the present invention is illuminated by a light source including a fiber that transmits light between the light source and the semiconductor material. In implementations, the light source transmits light through free space to the semiconductor material. In other implementations, the light source transmits light through an optically transparent material such as an optically transparent polymer or optically transparent solid material (e.g., 102 in FIG. 1). In embodiments, the light source(s) illuminates the semiconductor body from the top and/or from the side. In aspects of the invention, the light source is configured to produce photons with energies about equal to the bandgap of the semiconductor body material, or to produce energies with photons below the bandgap of the semiconductor body material.

In embodiments, the light source is in the form of an LED or laser integrated in or on the same package (e.g., housing 104, 204, 304, or 404) as the LSC switch. The LED or laser can illuminate the semiconductor body from the top side, the back side, or from more than one side of the semiconductor material.

In implementations, a light source (e.g., 106, 206, 306, or 406A-E) is comprised of or adapted from a commercial off-the-shelf (COTS) LED. Typically, commercial LEDs have a temperature rating of 120 degrees Celsius (° C.). In implementations, one or more light sources emit light having a wavelengths between 360 nm to 400 nm. In embodiments, when activated, a light source (e.g., 106, 206, 306, or 406A-E) has a light output of: 1 milliwatt (mW), 50 mW, 100 mW, 200 mW, 500 mW, 1000 mW, 2000 mW, 5000 mW, or 1000 mW. In implementations, one or more light sources comprise an ultraviolet (UV) LED. Smaller LEDs or an array of small LEDs have faster rise times (the time interval between one reference point on a waveform and a second reference point of greater magnitude on the same waveform) then larger LEDs. Small sized LEDs utilized in embodiments of the invention may have a rise time faster than 1-2 nanoseconds (ns). Mid-power 960 mW ultraviolet A (UVA) LEDs utilized in embodiments of the invention may have a rise time in the range of 10 ns to 50 ns. High power 3000 mW UVA LEDs utilized in embodiments of the invention may have a rise time in the range of 50 ns. Commercial UVA LEDs are often packaged with four LEDs on a common header package. In implementations, the light source comprises four low power UVA LEDs having an output power of approximately 100 mW each, packaged on a header to produce a total output power of 400 mW and having a rise time in the range of 10 ns.

In embodiments, the light source(s) (e.g., 106, 206, 306, or 406A-E) produces a free excess carrier density in the semiconductor body (e.g., 114, 214, 314, or 414) of: $1 \times 10^{14}$ $cm^{-3}$, $1 \times 10^{15}$ $cm^{-3}$, $5 \times 10^{15}$ $cm^{-3}$, $1 \times 10^{16}$ $cm^{-3}$, $5 \times 10^{16}$ $cm^{-3}$, $1 \times 10^{17}$ $cm^{-3}$, $5 \times 10^{17}$ $cm^{-3}$, $1 \times 10^{18}$ $cm^{-3}$, or $1 \times 10^{19}$ $cm^{-3}$. High voltage electrically gated unipolar semiconductor switches, such as a conventional SiC MOSFET with a 10 kV blocking voltage have a drift layer N-type dopant concentration of about $2 \times 10^{14}$ $cm^{-3}$, and produces about $2 \times 10^{14}$ $cm^{-3}$ free excess carriers from an ionized N-type dopant. Thus, utilizing an optical approach to produce excess free carriers in the conduction bands in a drift layer of an LCS switch in accordance with embodiments of the invention, can result in significantly larger excess free carrier densities and thus significantly lower on-resistance compared to a SiC MOSFET.

Figure 5:
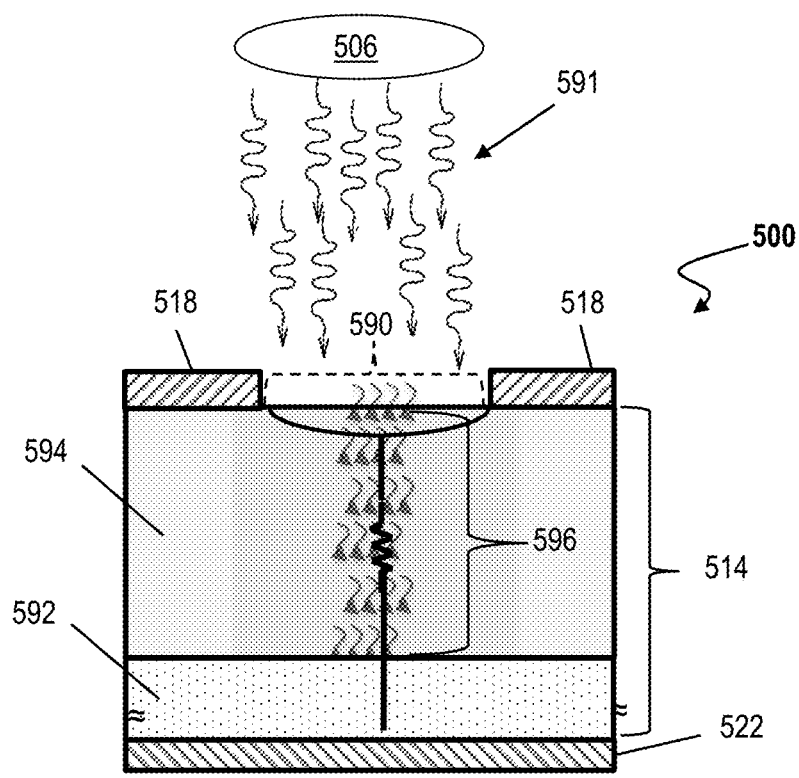
FIG. 5 illustrates an exemplary vertical light controlled semiconductor (LCS) switch in accordance with embodiments of the invention.

FIG. 5 illustrates an exemplary vertical LCS switch 500 in accordance with embodiments of the invention. The LCS switch 500 includes a semiconductor body 514 between an anode 522 and a cathode 518, wherein the cathode 518 is positioned to leave a top surface portion 590 of the semiconductor body 514 exposed to photons 591 from a light source 506. In the example of FIG. 5, the semiconductor body 514 comprises a substrate 592 and one or more photoactive layers indicated at 594. In implementations, the photoactive layer is selected from the group including: GaN doped with carbon (GaN:C), GaN doped with iron (GaN:Fe), AlN, and AGaN. In embodiments, the substrate 592 is selected from the group including: GaN and SiC.

In implementations, thick epitaxial layers are grown on native substrates homoepitaxially with high quality for vertical LCSMs, such as a metal-organic chemical vapor deposition (MOCVD) GaN:C layer on a bulk GaN substrate, which provides a reduction in dislocation density, extremely low unintentional doped carrier concentration, and less point defects. In one example, in order to obtain ~10 kV of voltage hold-off in a GaN substrate, an approximately 50 µm thick photoactive layer(s) is needed, which is achievable using high growth rate MOCVD. Voltage hold-off or breakdown voltage refers to the voltage that causes a leakage current between the cathode and anode of more than 1 microamp.

In implementations, for a vertical LCS switch (e.g., 500), the semiconductor body 514 thicknesses is engineered in conjunction with illumination wavelength selection to ensure an entire volume of the photoactive layer(s) can be optically modulated and the photons/light is not absorbed only at the surface 590. In one example, in order to achieve a 10 kV LCSM with a GaN LCS switch, the photoactive layer(s) 594 of the semiconductor body 514 absorbs light to a depth of about 50 µm deep to maximize on-state conductivity. In the example of FIG. 5, illumination wavelength penetration is depicted at 596.

Figure 6:
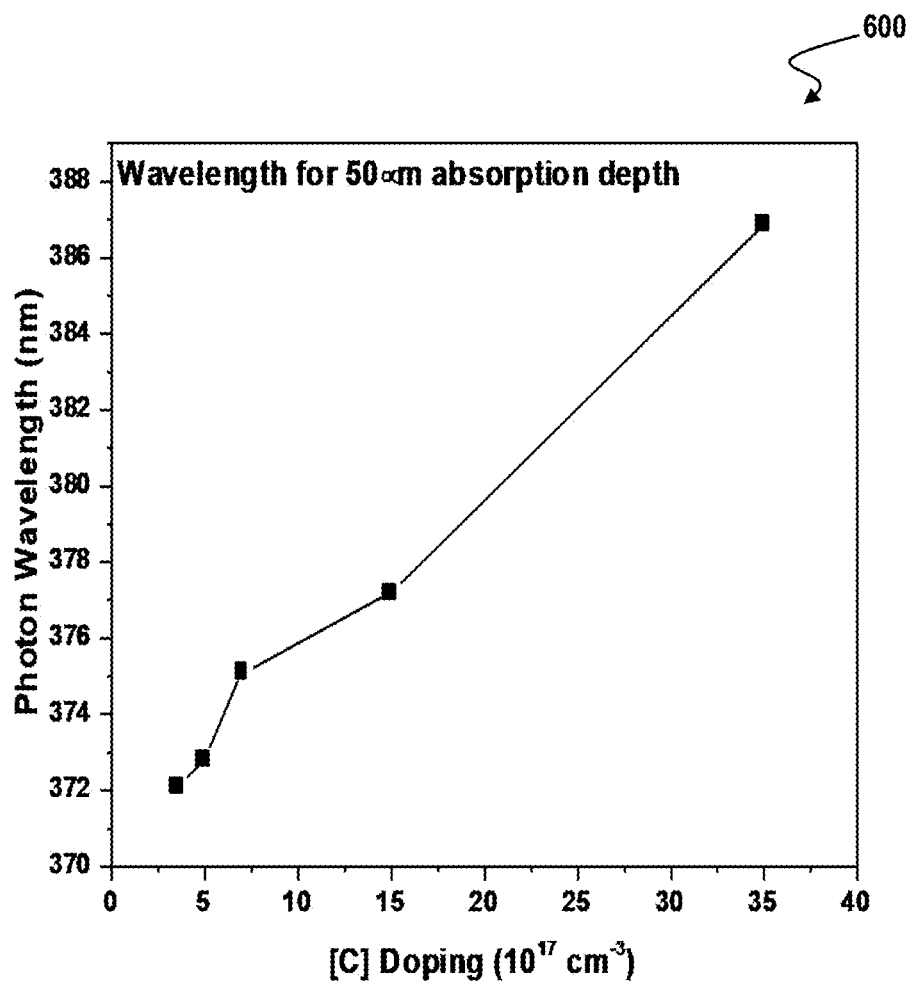
FIG. 6 is a graph illustrating illumination wavelengths required to penetrate 50 μm into a gallium nitride (GaN) semiconductor body.

FIG. 6 is a graph 600 illustrating illumination wavelengths required to penetrate 50 µm into a GaN semiconductor body. As shown in FIG. 6, with a light source(s) emitting light at wavelengths between 372 nm and 388 nm, significant photocurrent is realized at a photoactive layer (e.g., 594), where the photoactive layer comprises GaN doped with $10^{17}$ $cm^{-3}$ carbon.

Based on the above, it can be understood that embodiments of the invention provide a solution to the problems associated with conventional electrically gated unipolar semiconductor power devices, while providing necessary high voltage isolation for power converter gate control circuitry. Implementations of the invention result in a LCSM (e.g., 100, 200, 300, or 400) that includes one or more of: a 10 kV gate isolation; thermal isolation of the LCS switch, integrated light source/light source driver and LCS switch circuitry, a 370 nm near-UV LED light source, a light source emitting light at a sub bandgap wavelength to obtain deep light penetration into the semiconductor body, a light source focused on an active area (photoactive area) of a semiconductor body, top and bottom thermal management (heat dissipaters), low impedance electrical contacts (anodes and cathodes), and a compact housing on which elements of the LCSM are secured.

Techniques, systems, and devices are disclosed for implementing a LCS switch performing electrical bulk conduction with low resistance and high blocking voltage. In one exemplary aspect, an LCSM (e.g., 100, 200, 300, or 400) includes a light source (e.g., 106, 206, 306, or 406A-E) that is configured to be modulated to emit photons that illuminate a crystalline material (e.g., 594) of a LCS switch semiconductor body (e.g., 500) with energies below the bandgap or with energies above the bandgap; where the light source is electrically isolated from the photoconductor with an isolation voltage more than 100 V. In implementations, the light source is thermally isolated from the LCS switch (e.g., 108, 208, 208, 408) with a thermal conductivity of 1 W/mk; the LCS switch includes a direct bandgap crystalline material positioned to receive the light from the light source, wherein the direct bandgap crystalline material has a bandgap more than 3.3 eV at room temperature, and is doped with a photoactive dopant that forms radiative traps with energy levels within a bandgap of the direct bandgap crystalline material in order to control a recombination time of minority carriers and generate free excess carriers in the conduction band within the direct bandgap crystalline material. In embodiments, a first ohmic electrode (e.g., 118, 218, 218, or 418) coupled to the crystalline material to provide a first electrical ohmic contact for the crystalline material, and a second ohmic electrode (e.g., 116, 216, 316, or 416) is coupled to the crystalline material to provide a second ohmic electrical contact for the crystalline material, wherein the first and the second electrodes are configured to establish an electric field across the crystalline material, and the crystalline material is configured to exhibit a substantially linear transconductance in response to receiving the light. In embodiments, the modulated light source coverts the resistance element from a high resistance condition with a leakage current less than 1 microamp in an off state at more than 100 V to a low resistance condition with a resistance less than 5 ohms. In implementations heat dissipaters are provided to conduct heat from the photoconductor and the light source. In aspects, the light source can be a light emitting diode or a laser. In embodiments, the light source is electrically and thermally isolated from the LCS switch.

One application for enhanced system resilience is to use a LCS switch (e.g., 108, 208, 308, or 408) of the present invention for internal arc interruption. The less than 50 ns rise time capability of the LCS switch can interrupt the arc during the pre-arcing time. Acceleration of the protection system will result in reducing the arc duration and potentially the arc current magnitude. The 10 kV capability of the LCS switch helps ensure a resilient system during arc overvoltage. The low on resistance of the cooled LCS switch will limit the thermal energy (I2t) let through to the device during the fault. The LCS switch based arc eliminator can be used in a hybrid configuration with a mechanical switch similar to a thysistor based approach. One advantage of the LCS switch part of the hybrid switch is that the voltage drop on the LCS switch is smaller than the burning electric arc voltage, which causes the electric arc to be extinguished. The high-current mechanical short-circuiting switch relieves the LCS switch and takes over the flow of bypass current until the main circuit breaker is actuated.

Deep-level traps or deep-level defects are electronic defect in semiconductors. They are "deep" in the sense that the energy required to remove an electron or hole from the trap to the valance or conduction band is much larger than the characteristic thermal energy kT, where k is the Boltzmann constant, and T is the temperature. Deep traps can compensate the dominant charge carrier type, annihilating either free excess electrons or holes depending on which is more prevalent. Deep-level traps shorten the non-radiative lifetime of charge carriers, and through the Shockley-Read-Hall (SRH) process facilitate recombination of minority carriers.

Method of Making

In implementations, LCSMs (e.g., 100, 200, 300, or 400) of the present invention are manufactured such that a housing (e.g., 104, 204, 304, or 404) secures a light source (106, 206, 306, or 406A-E) at a fixed predetermined distance (e.g., 110, 210, 310, or 410) from a side surface of a semiconductor body (e.g., 114, 214, 314, or 414) of a LCS switch (e.g., 108, 208, 308, or 408). In embodiments, the housing also secures electrical contacts of a light source circuit and a LCS switch circuit of the LCSM, as well as one or more heat dissipaters (e.g., 112A, 112B, 212A, 212B, 376, 312B, or 412B). In aspects of the invention, a method includes: mounting an LCS switch to a housing; mounting a light source to the housing at a predetermined distance from a top surface of a semiconductor body of the LCS switch; mounting an anode and cathode in electrical communication with the LCS switch to the housing; mounting an anode and cathode in electrical communication with the light source to the housing, wherein the LCS switch is electrically and thermally insulated from the light source. Elements of the LCSM may be mounted to the housing using a variety of methods, including soldering, securing with mechanical fasteners or adhesives, and friction fitting, for example. The invention is not intended to be limited to any particular method of securing elements to the housing discussed herein.

In implementations, the housing is manufactured using a three dimensional (3D) printer, and includes spacers configured to separate and electrically isolate the light source and light source circuit from the semiconductor body and semiconductor circuit. In aspects of the invention, the LCS switch (e.g., 108, 208, 308, or 408) is electrically isolated from the light source (106, 206, 306, or 406A-E) with an isolation voltage of greater than 100V. The term isolation voltage as used herein refers to a test voltage at which an insulator (e.g., the housing and associated insulating layers of the LCSM) has the ability to block the flow of electric current. In implementations, the LCS switch is thermally isolated from the light source with a thermal conductivity of less than or equal to 1 W/mk. The term thermal conductivity as used herein refers to a measure of an item's ability to conduct heat.

In implementations, a first heat dissipater (e.g., 112A, 212A, or 376) is mounted to the housing adjacent the light source and is configured to draw heat away from the light source. In embodiments, a second heat dissipater (e.g., 112B, 212B, 312B, or 412B) is mounted to the housing adjacent the LCS switch and is configured to draw heat away from the LCS switch. In implementations, a reflector is mounted to the housing in a position to cause light from at least one light source (e.g., 405E) to impinge on a side portion (e.g., 486) of the semiconductor body. In aspects of the invention, additional elements are mounted to the housing and are in communication with electrical contacts of the light source circuit, including one or more of a light source driver (e.g., 260), a field-effect transistor (FET) switch (e.g., 262), a current limiting resistor circuit (and optionally a current pull out circuit) (e.g., 264), a gate driver input (e.g., 266), and a gate driver drain power voltage (VDD) bus (e.g., 268).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A light controlled switch module (LCSM) comprising:
a housing;
a light controlled semiconductor switch mounted to the housing, the light controlled semiconductor switch including a semiconductor body;
at least one light source mounted to the housing in a spaced relationship from the light controlled semiconductor switch and positioned to direct light emitted from the at least one light source toward the semiconductor body; and
first and second electrodes mounted to the housing and connected to the light controlled semiconductor switch, wherein the first and second electrodes are configured to have variable resistance between the first and the second electrode.

2. The LCSM of claim 1, wherein the at least one light source is electrically isolated from the light controlled semiconductor switch.

3. The LCSM of claim 2, wherein the at least one light source is electrically isolated from the light controlled semiconductor switch with an isolation voltage of more than 100 volts (V).

4. The LCSM of claim 1, wherein the at least one light source is thermally isolated from the light controlled semiconductor switch.

5. The LCSM of claim 4, wherein the at least one light source is thermally isolated from the light controlled semiconductor switch with a thermal conductivity of less than or equal to 1 Watts per meter-Kelvin (W/mk).

6. The LCSM of claim 1, further comprising: a heat dissipater mounted to the housing and configured to draw heat away from the at least one light source.

7. The LCSM of claim 1, further comprising: a heat dissipater mounted to the housing and configured to draw heat away from the light controlled semiconductor switch.

8. The LCSM of claim 1, further comprising: third and fourth electrodes mounted to the housing and configured to supply electrical current to the at least one light source, wherein the housing electrically isolates the third and fourth electrodes from the first and second electrodes.

9. The LCSM of claim 1, further comprising: a reflector mounted to the housing and configured to redirect light emitted by the at least one light source such that the light emitted by the at least one light source is directed to a surface of the semiconductor body.

10. The LCSM of claim 1, wherein the semiconductor body comprises a photoactive layer on a substrate, and the light emitted from the at least one light source is directed toward one or more surfaces of the photoactive layer.

11. The LCSM of claim 1, wherein the photoactive layer is selected from the group consisting of: carbon doped gallium nitride (GaN:C); iron doped gallium nitride (GaN: Fe); gallium oxide ($Ga_2O_3$); aluminum nitride (AlN); cubic boron nitride (c-BN); and diamond.

12. The LCSM of claim 1, further comprising a thermal barrier positioned between the at least one light source and the light controlled semiconductor switch.

13. A method of using a light controlled switch module (LCSM) comprising:
   initiating the application of an electric voltage to first and second electrodes mounted to a housing of the LCSM, wherein the first and second electrodes are configured to supply electric current to a light controlled semiconductor switch mounted to the housing, thereby establishing an electric field through a semiconductor body of the light controlled semiconductor switch;
   initiating the application of an electric current to third and fourth electrodes mounted to the housing, wherein the third and fourth electrodes are configured to supply electric current to at least one light source mounted to the housing in a spaced relationship to the light controlled semiconductor switch; and
   emitting, by the at least one light source in response to initiating the application of the electric current to the third and fourth electrodes, light toward a surface of the semiconductor body, thereby causing the light controlled semiconductor switch to switch from a non-conducting state to a conducting state.

14. The method of claim 13, further comprising:
   dissipating heat from at least one of the at least one light source and the light controlled semiconductor switch via at least one heat dissipater mounted to the housing.

15. The method of claim 14, further comprising:
   redirecting, by a reflector mounted to the housing, at least a portion of the light emitted by the at least one light source such that the light emitted by the at least one light source is directed to another surface of the semiconductor body.

16. A method of making a light controlled switch module (LCSM) comprising:
   mounting a light controlled semiconductor switch to a housing, the light controlled semiconductor switch including a semiconductor body;
   mounting at least one light source to the housing in a spaced relationship from the light controlled semiconductor switch and positioned to direct light emitted from the at least one light source toward a surface of the semiconductor body; and
   mounting first and second electrodes to the housing, wherein the first and second electrodes are configured to supply electrical current to the light controlled semiconductor switch.

17. The method of claim 16, wherein the one or more light sources are electrically and thermally isolated from the light controlled semiconductor switch.

18. The method of claim 16, further comprising:
   mounting a first heat dissipater to the housing such that the first heat dissipater draws heat away from the at least one light source; and
   mounting a second heat dissipater to the housing such that the second heat dissipater draws heat away from the light controlled semiconductor switch.

19. The method of claim 16, further comprising mounting a reflector to the housing to redirect at least a portion of the light emitted by the at least one light source to another surface of the semiconductor body.

20. The method of claim 16, wherein the semiconductor body comprises a photoactive layer on a substrate, and the light emitted from the at least one light source is directed toward the surface of the semiconductor body through a gap in the first electrode.

* * * * *